US011888448B2

(12) United States Patent
Pham et al.

(10) Patent No.: US 11,888,448 B2
(45) Date of Patent: Jan. 30, 2024

(54) LOW-LOAD-MODULATION BROADBAND AMPLIFIER (71) Applicant: MACOM Technology Solutions Holdings, Inc., Lowell, MA (US)

(72) Inventors: Bi Ngoc Pham, Oakville (CA); Kelly Doherty, Chapel Hill, NC (US)

(73) Assignee: MACOM TECHNOLOGY SOLUTIONS HOLDINGS, INC., Lowell, MA (US)

( * ) Notice: Subject to any disclaimer, the term of this patent is extended or adjusted under 35 U.S.C. 154(b) by 165 days.

(21) Appl. No.: 17/095,873

(22) Filed: Nov. 12, 2020

(65) Prior Publication Data
US 2021/0203279 A1 Jul. 1, 2021

Related U.S. Application Data (60) Provisional application No. 62/954,830, filed on Dec. 30, 2019.

(51) Int. Cl.
*H03F 1/02* (2006.01)
*H03F 1/42* (2006.01)
(Continued)

(52) U.S. Cl.
CPC .......... *H03F 1/0288* (2013.01); *H03F 1/42* (2013.01); *H03F 3/211* (2013.01); *H03F 1/565* (2013.01);
(Continued)

(58) Field of Classification Search
CPC .......... H03F 1/0288; H03F 1/42; H03F 3/211; H03F 1/565; H03F 2200/222; H03F 2200/36; H03F 2200/451
(Continued)

(56) References Cited

U.S. PATENT DOCUMENTS

| 4,375,054 A | 2/1983 | Pavio |
| 6,085,074 A | 7/2000 | Cygan |

(Continued)

FOREIGN PATENT DOCUMENTS

| CN | 101494439 A | 7/2009 |
| CN | 102137518 A | 7/2011 |

(Continued)

OTHER PUBLICATIONS

Vigneau et al. Fully integrated three-way LDMOS Doherty PAs for 1.8-2.2 GHz dual-band and 2.6 GHz m-MIMO 5G applications, Published in International Journal of Microwave and Wireless Technologies, Mar. 1, 2021 (Year: 2021).*

(Continued)

*Primary Examiner* — Hafizur Rahman
(74) *Attorney, Agent, or Firm* — Perilla Knox & Hildebrandt LLP; Jason M. Perilla (57) ABSTRACT

Low-load-modulation, broadband power amplifiers and method of use are described. The amplifiers can include multiple amplifiers connected in parallel to amplify a signal that has been divided into parallel circuit branches. One of the amplifiers can operate as a main amplifier in a first amplification class and the remaining amplifiers can operate as peaking amplifiers in a second amplification class. The main amplifier can see low modulation of its load between the fully-on and fully-backed-off states of the amplifier. With lower load modulation, the power amplifiers described herein exhibit better power-handling capability and RF fractional bandwidth as compared to conventional amplifiers.

27 Claims, 6 Drawing Sheets

(51) Int. Cl.
*H03F 3/21* (2006.01)
*H03F 1/56* (2006.01)
(52) U.S. Cl.
CPC .... *H03F 2200/222* (2013.01); *H03F 2200/36* (2013.01); *H03F 2200/451* (2013.01)
(58) Field of Classification Search
USPC ........................................................ 330/295
See application file for complete search history.

(56) References Cited

U.S. PATENT DOCUMENTS

| | | |
|---|---|---|
| 6,262,629 B1 | 7/2001 | Stengel et al. |
| 6,649,287 B2 | 11/2003 | Weeks et al. |
| 6,791,417 B2 | 9/2004 | Pengelly et al. |
| 7,078,976 B2 | 7/2006 | Blednov |
| 7,109,790 B2 | 9/2006 | Kwon et al. |
| 7,218,175 B1 | 5/2007 | Kobayashi |
| 7,414,478 B2 | 8/2008 | Elmala et al. |
| 7,541,866 B2 | 6/2009 | Bowles et al. |
| 7,602,241 B2 | 10/2009 | Suzuki et al. |
| 7,663,434 B2 | 2/2010 | Yang et al. |
| 7,876,159 B2 | 1/2011 | Wang et al. |
| 7,973,600 B2 | 7/2011 | Yu |
| 8,237,498 B2 | 8/2012 | Kato et al. |
| 8,358,174 B2 | 1/2013 | Kim et al. |
| 8,395,450 B2 | 3/2013 | Deguchi et al. |
| 8,466,746 B2 | 6/2013 | Jeong et al. |
| 8,487,703 B2 | 7/2013 | Blednov |
| 9,071,211 B1 | 6/2015 | Ozard |
| 9,083,284 B2 | 7/2015 | Maslennikov et al. |
| 9,331,638 B2 | 5/2016 | Chen et al. |
| 9,531,329 B2 | 12/2016 | Tanimoto |
| 9,543,914 B2 | 1/2017 | Bouny |
| 9,621,115 B1 | 4/2017 | Wu |
| 9,667,199 B1 | 5/2017 | McLaren |
| 9,673,766 B1 | 6/2017 | Roberts et al. |
| 9,774,301 B1 | 9/2017 | Maalouf et al. |
| 9,813,036 B2 | 11/2017 | Folkmann et al. |
| 9,966,903 B1 | 5/2018 | McLaren et al. |
| 10,211,785 B2 | 2/2019 | McLaren |
| 10,284,146 B2 | 5/2019 | Wu et al. |
| 10,284,147 B2 | 5/2019 | Wu et al. |
| 10,305,437 B2 | 5/2019 | Ozard et al. |
| 11,018,629 B2 | 5/2021 | Min et al. |
| 11,050,389 B2 | 6/2021 | Cassou et al. |
| 11,159,125 B2 | 10/2021 | Bouisse et al. |
| 11,190,143 B2 | 11/2021 | Pham et al. |
| 11,233,483 B2 | 1/2022 | Bouisse et al. |
| 11,245,363 B2 | 2/2022 | Bouisse |
| 11,283,410 B2 | 3/2022 | Bouisse |
| 11,496,098 B2 | 11/2022 | Wang |
| 11,515,842 B2 | 11/2022 | Wang et al. |
| 11,522,499 B2 | 12/2022 | Hue et al. |
| 2003/0137346 A1 | 7/2003 | Hellberg |
| 2003/0141933 A1 | 7/2003 | Pengelly |
| 2005/0206462 A1 | 9/2005 | McCorquodale et al. |
| 2006/0097783 A1 | 5/2006 | Okubo et al. |
| 2006/0145757 A1 | 7/2006 | Kim et al. |
| 2007/0205827 A1 | 9/2007 | Mobbs |
| 2010/0315162 A1 | 12/2010 | Gajadharsing et al. |
| 2011/0140775 A1 | 6/2011 | Hong et al. |
| 2011/0193624 A1 | 8/2011 | Scott et al. |
| 2011/0204980 A1 | 8/2011 | Blednov |
| 2012/0025915 A1 | 2/2012 | Ui |
| 2012/0092074 A1 | 4/2012 | Yanduru et al. |
| 2012/0105147 A1 | 5/2012 | Harris et al. |
| 2012/0319780 A1* | 12/2012 | Wilson .................... H03F 3/604 330/295 |
| 2013/0093534 A1 | 4/2013 | Mei |
| 2013/0154729 A1 | 6/2013 | Folkmann et al. |
| 2014/0118070 A1 | 5/2014 | Wilson et al. |
| 2014/0132343 A1 | 5/2014 | Colantonio et al. |
| 2014/0146917 A1 | 5/2014 | Muhammad |
| 2014/0218116 A1 | 8/2014 | Cui et al. |
| 2015/0002227 A1 | 1/2015 | Pribble et al. |
| 2015/0002230 A1 | 1/2015 | Qureshi |
| 2015/0091651 A1 | 4/2015 | Seneviratne et al. |
| 2015/0155838 A1 | 6/2015 | Embar et al. |
| 2015/0180428 A1 | 6/2015 | Pham et al. |
| 2016/0036398 A1 | 2/2016 | Li |
| 2016/0268976 A1 | 9/2016 | Negra et al. |
| 2016/0336903 A1 | 11/2016 | Ahmed et al. |
| 2017/0016322 A1 | 1/2017 | Hagenbuch |
| 2017/0019071 A1 | 1/2017 | Kobayashi et al. |
| 2017/0070193 A1 | 3/2017 | Juang et al. |
| 2017/0085228 A1 | 3/2017 | Abdo et al. |
| 2017/0163221 A1 | 6/2017 | Takagi et al. |
| 2018/0026583 A1 | 1/2018 | Yanduru et al. |
| 2018/0034418 A1 | 2/2018 | Blednov |
| 2018/0034419 A1 | 2/2018 | Moronval |
| 2018/0183388 A1 | 6/2018 | Pham |
| 2018/0191309 A1 | 7/2018 | McLaren |
| 2018/0233578 A1 | 8/2018 | Shi et al. |
| 2018/0248521 A1 | 8/2018 | Min et al. |
| 2018/0254748 A1 | 9/2018 | Grebennikov et al. |
| 2019/0027442 A1 | 1/2019 | Ercoli |
| 2019/0036487 A1* | 1/2019 | Jiang .................... H03F 1/56 |
| 2019/0333878 A1 | 10/2019 | Wu et al. |
| 2019/0356277 A1 | 11/2019 | Bouisse et al. |
| 2020/0212847 A1 | 7/2020 | Pham et al. |
| 2021/0013572 A1 | 1/2021 | Zhu |
| 2021/0013836 A1 | 1/2021 | Bouisse et al. |
| 2022/0085772 A1 | 3/2022 | Holmes et al. |
| 2022/0123693 A1 | 4/2022 | Wang et al. |

FOREIGN PATENT DOCUMENTS

| | | |
|---|---|---|
| CN | 102545788 A | 7/2012 |
| CN | 102577104 A | 7/2012 |
| CN | 103415993 A | 11/2013 |
| CN | 103457541 A | 12/2013 |
| CN | 102549915 A | 4/2015 |
| CN | 104660176 A | 5/2015 |
| CN | 104704747 A | 6/2015 |
| CN | 105322893 A | 2/2016 |
| CN | 105637759 A | 6/2016 |
| CN | 106357222 A | 1/2017 |
| CN | 110785928 A | 2/2020 |
| CN | 107210713 B | 3/2022 |
| EP | 2442444 A1 | 4/2012 |
| EP | 2458730 A1 | 5/2012 |
| EP | 2698918 A1 | 2/2014 |
| EP | 2806557 A1 | 11/2014 |
| EP | 2876810 B1 | 4/2016 |
| EP | 3133735 A1 | 2/2017 |
| EP | 3179638 A1 | 6/2017 |
| EP | 3054589 B1 | 7/2018 |
| EP | 3121960 B1 | 10/2019 |
| EP | 3179628 B1 | 4/2021 |
| JP | 2012222624 A | 11/2012 |
| TW | I336996 B | 2/2011 |
| TW | I377783 B | 11/2012 |
| TW | I462469 B | 11/2014 |
| TW | 201611514 A | 3/2016 |
| WO | 2009027916 A2 | 3/2009 |
| WO | 2015176077 A2 | 11/2015 |
| WO | 2017192075 A1 | 11/2017 |
| WO | 2018142176 A1 | 8/2018 |
| WO | 2018142177 A1 | 8/2018 |
| WO | 2018142178 A1 | 8/2018 |
| WO | 2018197917 A1 | 11/2018 |
| WO | 2018197918 A1 | 11/2018 |
| WO | 2018197919 A1 | 11/2018 |
| WO | 2019036499 A1 | 2/2019 |
| WO | 2019069115 A1 | 4/2019 |
| WO | 2020072898 A1 | 4/2020 |
| WO | 2021137951 A1 | 7/2021 |

OTHER PUBLICATIONS

International Search Report for PCT/US2020/060158 dated Mar. 10, 2021.

(56) References Cited

OTHER PUBLICATIONS

Daniel Popp et al: High Power and High Bandwidth Digital Three-Way Doherty Power Amplifier, 2019 IEEE 20th Wireless and Microwave Technology Conference (WAMICON), IEEE, Apr. 8, 2019 (Apr. 8, 2019), pp. 1-6, XP033577671, DOI: 10.1109/WAMICON.2019.8765455 [retrieved on Jul. 16, 2019].

Xia Jing et al: "Improved Three-Stage Doherty Amplifier Design With Impedance Compensation in Load Combiner for Broadband Applications", IEEE Transactions on Microwave Theory and Techniques, Plenum, USA, vol. 67, No. 2, Feb. 1, 2019 (Feb. 1, 2019), pp. 778-786, XP011708207, ISSN: 0018-9480, DOI: 10.1109/TMTT.2018.2884404 [retrieved on Feb. 4, 2019].

Barthwal Ayushi et al: "A Design Strategy for Bandwidth Enhancement in Three-Stage Doherty Power Amplifier With Extended Dynamic Range", IEEE Transactions on Microwave Theory and Techniques, Plenum, USA, vol. 66, No. 2, Feb. 1, 2018 (Feb. 1, 2018), pp. 1024-1033, XP011676535, ISSN: 0018-9480, DOI: 10.1109/TMTT.2017.2751044 [retrieved on Feb. 2, 2018].

Andrei Grebennikov, "A high-efficiency 100-W four-stage Doherty GaN HEMT power amplifier module for WCDMA systems", 2011 IEEE MTT-S International Microwave Symposium.

C.F. Campbell, "A fully integrated Ku-band Doherty amplifier MMIC", IEEE Microwave and Guided Wave Letters, (Mar. 1, 1999), vol. 9, No. 3, doi:10.1109/75.761678, ISSN 1051-8207, pp. 114-116.

Camarchia et al., "7 GHz MMIC GaN Doherty Power Amplifier With 47% Efficiency at 7 dB Output Back-Off," IEEE Microwave and Wireless Components Letters. Jan. 2013.

Ceylan et al, "Refine Biasing Networks for High PA Low Frequency Stability," Microwave & RF, Apr. 17, 2018, pp. 1-6.

Cidronali et al, "Frequency Analysis and Multiline Implementation of Compensated Impedance Inverter for Wideband Doherty High-Power Amplifier Design," IEEE Transactions on Microwave Theory and Techniques. May 2016; 64(5):1359-72.

Daehyun Kang et al, "30.3% PAE HBT Doherty power amplifier for 2.5-2.7 GHz mobile WiMAX," Microwave Symposium Digest (MTT), 2010 IEEE MTT-S International, IEEE, Piscataway, NJ, USA, Piscataway, NJ, USA , (May 23, 2010), ISBN 978-1-4244-6056-4, pp. 796-799.

Daekyu Yu et al, "Fully Integrated Doherty Power Amplifiers for 5 GHz Wireless-LANs", Radio Frequency Integrated Circuits (RFIC) Symposium, 2006 IEEE, IEEE, Piscataway, NJ, USA, (Jun. 11, 2006), doi:10.1109/RFIC.2006.1651114, ISBN 978-0-7803-9572-5, pp. 153-156.

Grebennikov et al, "High-Efficiency Doherty Power Amplifiers: Historical Aspect and Modern Trends," Proceedings of the IEEE. Dec. 2012; 100(12):3190-219.

International Search Report and Written Opinion for Application No. PCT/IB2017/000604 dated Sep. 8, 2017.

International Search Report and Written Opinion for Application No. PCT/IB2017/000608, dated Sep. 8, 2017.

International Search Report and Written Opinion for Application No. PCT/IB2017/000639 dated Sep. 8, 2017.

International Search Report and Written Opinion for Application No. PCT/IB2017/000717 dated Dec. 6, 2017.

International Search Report and Written Opinion for Application No. PCT/IB2017/000722 dated Nov. 7, 2017.

International Search Report and Written Opinion for Application No. PCT/IB2017/000727 dated Oct. 19, 2017.

International Search Report and Written Opinion for Application No. PCT/IB2017/001575 dated Jun. 18, 2018.

International Search Report and Written Opinion for Application No. PCT/IB2018/046754 dated Nov. 22, 2018.

International Search Report and Written Opinion for Application No. PCT/US2017/068164 dated Mar. 13, 2018.

International Search Report and Written Opinion for International Application No. PCT/US2019/054686, dated Dec. 19, 2019.

International Search Report and Written Opinion in Application No. PCT/US2020/060158, dated Mar. 10, 2021.

Kim et al, "Doherty Linear Power Amplifiers for Mobile Handset Applications. Proceedings of Asia-Pacific Microwave Conference," Dec. 2006; 1885-94.

Merrick B et al, "A wideband Sequential Power Amplifier", 2014 IEEE MTT-S International Microwave Symposium (IMS2014), IEEE, (Jun. 1, 2014), doi:10.1109/MWSYM.2014.6848592, pp. 1-3, XP032615303.

Moronval et al, "A 100 W Multi-Band Four-Way Integrated Doherty Amplifier," IEEE MTT-S International Microwave Symposium (IMS) May 22, 2016: 1-3.

Office Action for European Application No. 17825920.6 dated Dec. 1, 2021.

Office Action for Taiwanese Application No. 107113817 dated Oct. 6, 2021, with Translation.

Office Action from European Application No. 17726354.8 dated May 27, 2021.

Office Action from European Application No. 17728258.9 dated May 27, 2021.

Office Action from European Application No. 17732555.2 dated Aug. 11, 2021.

Office Action from European Application No. 17734137.7 dated Aug. 9, 2021.

Office Action in CN Application No. 201780092425.1, dated Jan. 10, 2023, With Summary.

Office Action in CN Patent Application No. 2017800924285, dated Dec. 23, 2022, with Translation.

Office Action in EP 17726356.3, dated May 20, 2021.

Office Action in EP 18759225.8, dated Oct. 27, 2021.

Office Action in TW Application No. 107103816, with Search Report, dated Feb. 25, 2021, with Translation.

Office Action in TW Application No. 107103822, with Search Report, dated Feb. 24, 2021, with Translation.

Office Action in TW Patent Application No. 107113817 dated Jan. 21, 2021, with Translation.

Quaglia et al, "K-Band GaAs MMIC Doherty Power Amplifier for Microwave Radio With Optimized Driver," IEEE Transactions on Microwave Theory and Techmques. Nov. 2014; 62(11):2518-25.

Roberts Michael James, "Understanding the 3 level Doherty", 2016 11th European Microwave Integrated Circuits Conference (EUMIC), European Microwave Association, (Oct. 3, 2016), doi:10.1109/EUMIC.2016.7777583, pp. 428-432.

Search Report for Taiwanese Application No. 107113802 dated May 25, 2021.

Translation of Office Action in TW Patent Application No. 107103832, with Search Report dated Feb. 25, 2021.

Vigneau et al, "Fully integrated three-way LDMOS Doherty PAs for 1.8-2.2 GHz dual-band and 2.6 GHz m-MIMO 5G applications," Published in International Journal of Microwave and Wireless Technologies, Mar. 1, 2021.

Wicks B et al, "A 60-GHz fully-integrated Doherty power amplifier based on 0.13-um CMOS process," Radio Frequency Integrated Circuits Symposium, 2008. RFIC 2008. IEEE, IEEE, Piscataway, NJ, USA, (Jun. 17, 2008), ISBN 978-1-4244-1808-4, pp. 69-72.

Yu et al, "Fully Integrated Doherty Power Amplifiers for 5 GHz Wireless-LANs," IEEE Radio Frequency Integrated Circuits Symposium (RFIC). Jun. 11, 2006; 153-6.

Zhou et al, "Design of an S-Band Two-Way Inverted Asymmetrical Doherty Power Amplifier for Long Term Evolution Applications," Progress in Electromagnetics Research Letters. 2013; 39:73-80.

Cheng et al, "GaN HEMT Based Doherty Broadband Power Amplifier," Journal of Hangzhou Dianzi University (Natural Sciences), Mar. 15, 2017.

* cited by examiner

LOW-LOAD-MODULATION BROADBAND AMPLIFIER

CROSS-REFERENCE TO RELATED APPLICATIONS

This application claims the benefit of U.S. Provisional Application No. 62/954,830, filed Dec. 30, 2019, the entire contents of which is hereby incorporated herein by reference.

BACKGROUND

The technology described herein relates to high-speed, efficient, broadband, high-power amplifiers which can be constructed from multiple transistors operating in parallel circuit paths and formed from semiconductor materials such as, but not limited to, gallium-nitride (GaN) materials.

Applications supporting mobile communications and wireless internet access under current and proposed communication standards, such as WiMax, 4G, and 5G, can place austere performance demands on high-speed amplifiers constructed from semiconductor transistors. The amplifiers may need to meet performance specifications related to output power, signal linearity, signal gain, bandwidth, and efficiency.

High-speed power amplifiers formed from semiconductor materials have a variety of useful applications, such as radio-frequency (RF) communications, radar, RF energy, power conversion, and microwave applications. Beyond semiconductor materials, GaN materials have also received appreciable attention in recent years because of the desirable electronic and electro-optical properties of the materials. Because of its wide bandgap, gallium nitride materials are useful for high-speed, high-voltage, and high-power applications.

SUMMARY

An apparatus and methods for amplifying radio-frequency signals are described. A multiclass power amplifier can include a plurality of amplifiers operating in parallel in different amplification classes that provide amplified signals to a common output. A main amplifier can amplify signals at low signal levels and high signal levels. Secondary amplifiers can be idle (non-amplifying) at low signal levels and become active (amplifying) as signal levels increase. Additionally, the secondary amplifiers can see a same impedance at their outputs.

Some embodiments relate to low-load-modulation, broadband power amplifiers. An example amplifier can comprise a main amplifier coupled to a first combining node; a first impedance inverter connected between the main amplifier and the first combining node; a first peaking amplifier coupled to the first combining node; a second impedance inverter connected between the first combining node and a second combining node; a second peaking amplifier coupled to the second combining node; and a third impedance inverter connected between the second peaking amplifier and the second combining node, wherein the main amplifier, first peaking amplifier, and second peaking amplifier are in three parallel circuit branches.

Some embodiments relate to methods of operating a power amplifier. An example method can comprise acts of amplifying, with a main amplifier, a first portion of a received signal; providing a first output from the main amplifier to a first impedance inverter; receiving, at a first combining node, a first signal from the first impedance inverter; amplifying, with a first peaking amplifier arranged in parallel with the main amplifier, a second portion of the received signal; receiving, at the first combining node, a second signal from the first peaking amplifier; providing a first combined signal from the first combining node to a second impedance inverter; providing an output signal from the second impedance inverter to a second combining node; amplifying, with a second peaking amplifier arranged in parallel with the first peaking amplifier, a third portion of the received signal; providing an output from the second peaking amplifier to a third impedance inverter; and receiving, at the second combining node, a third signal from the third impedance inverter.

The foregoing apparatus and method embodiments can be implemented with certain combinations of aspects, features, and acts described above or in further detail below. These and other aspects, embodiments, and features of the present teachings can be more fully understood from the following description in conjunction with the accompanying drawings.

BRIEF DESCRIPTION OF THE DRAWINGS

Aspects of the present disclosure can be better understood with reference to the following drawings. The elements in the drawings are not necessarily to scale, with emphasis instead being placed upon clearly illustrating the principles of the embodiments. The same reference numbers are used among the figures, generally, to refer to the same or functionally and/or structurally similar elements. Only a limited number of devices or circuit structures are shown, to simplify the drawings. In practice, a large number of devices or circuits may be fabricated across a large area of a substrate or entire substrate. Additionally, a depicted device or circuit may be integrated within a larger circuit.

DETAILED DESCRIPTION

Devices formed from gallium nitride (GaN) materials offer relatively high breakdown voltages, high electron mobility, and high saturation velocity. As an example, devices formed from GaN are good candidates for high-power and high-temperature microwave applications. GaN devices are particularly suitable for microwave radio-frequency power amplifiers, including those used for high-speed wireless data transmission. GaN transistors maintain good performance at higher temperatures because the large band gap of GaN transistors leads to a reduction in the generation of charge carriers inherent in semiconductors. Aluminum gallium nitride (AlGaN) devices, as another example, also offer benefits similar to those of GaN devices.

Figure 1:
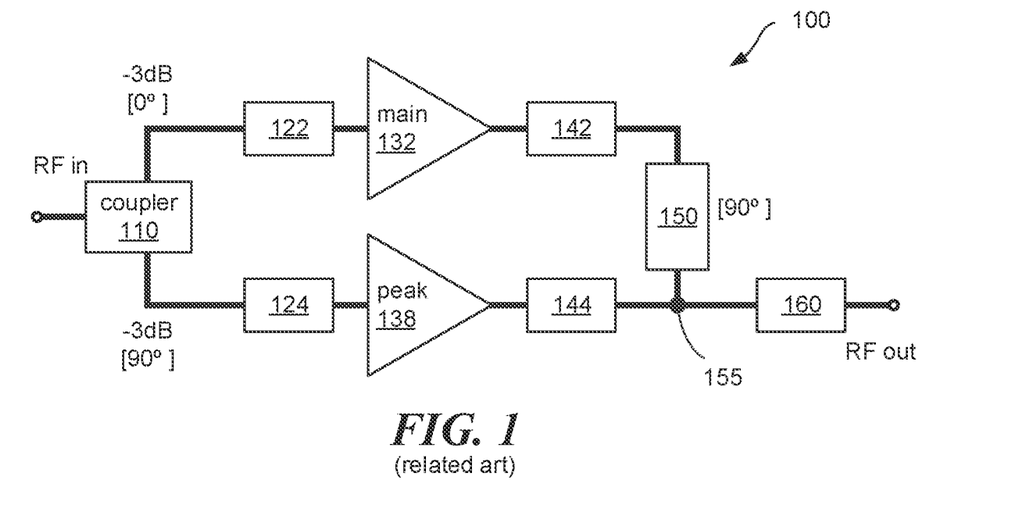
FIG. 1 illustrates an arrangement of a Doherty amplifier according to various embodiments described herein.

Doherty amplifiers offer one approach to amplifying signals to high power levels for wireless communications. FIG. 1 illustrates an arrangement of an example Doherty amplifier 100 according to various embodiments described herein. The Doherty amplifier 100 is provided as a representative example in FIG. 1 for the purposes of discussion. Thus, the structure and arrangement of the Doherty amplifier 100 is provided by way of example only. The concepts described herein are applicable to other types of Doherty amplifiers.

The Doherty amplifier 100 includes a main amplifier 132 and a peaking amplifier 138. The main amplifier 132 and the peaking amplifier 138 operate in parallel on an input radio frequency (RF) signal, which is divided into parallel circuit branches by a 90-degree power coupler 110. The peaking amplifier 138 is typically idle (e.g., not amplifying) at relatively low input RF signal levels, and the peaking amplifier 138 turns on when the main amplifier 132 begins to saturate. Outputs from the peaking amplifiers 132 and 138 are subsequently combined into a single RF output.

The 90-degree power coupler 110 divides the input RF signal into two outputs that are coupled, respectively, to the main amplifier 132 and the peaking amplifier 138. The power coupler 110 also delays the phase of the signal provided to the peaking amplifier 138 with respect to the phase of the signal provided to the main amplifier 132, typically by approximately 90 degrees.

In the example shown in FIG. 1, the Doherty amplifier 100 includes a first impedance-matching component 122 that is electrically coupled between the power coupler 110 and the main amplifier 132. The Doherty amplifier 100 also includes a second impedance-matching component 124 that is electrically coupled between the power coupler 110 and the peaking amplifier 138. The impedance-matching components 122, 124 transform the input impedances of the peaking amplifiers 132 and 138 to the impedances of the transmission lines connected to the amplifier inputs or to the output impedances of the power coupler 110. Such impedance matching can reduce undesirable effects of signal reflections from the amplifiers.

Doherty amplifier 100 includes a third impedance-matching component 142 located at the output of the main amplifier 132 to match impedances between the output of the main amplifier 132 and the input of an impedance inverter 150 (which may be 50 ohms by design). The Doherty amplifier 100 includes a fourth impedance-matching component 144 located at the output of the peaking amplifier 138 to match impedances between the output of the peaking amplifier 138 and an impedance at the combining node 155 (which may also be 50 ohms).

The impedance inverter 150 rotates the phase of the signal received from the main amplifier 132 by approximately 90 degrees, so that the signals from the main amplifier 132 and peaking amplifier 138 will be substantially in phase at the combining node 155. The Doherty amplifier 100 also includes an output impedance-matching element 160 between the combining node 155 and the RF output, to match the output impedance of the Doherty amplifier 100 to an impedance of a load.

When the Doherty amplifier 100 is designed as a symmetric amplifier, the main amplifier 132 and the peaking amplifier 138 are designed as similar or identical semiconductor devices. For example, they may be configured to handle a same amount of signal power and amplify a signal to a same power level when both amplifiers are fully on and amplifying at their upper limit. Because the input signal is split equally to the amplifiers, the signals to the main amplifier 132 and the peaking amplifier 138 are typically reduced by 3 dB at each output port of the power coupler 110, as compared to the input RF signal, due to the splitting. Signal values expressed in "dB" refer to relative power levels.

Figure 2A:
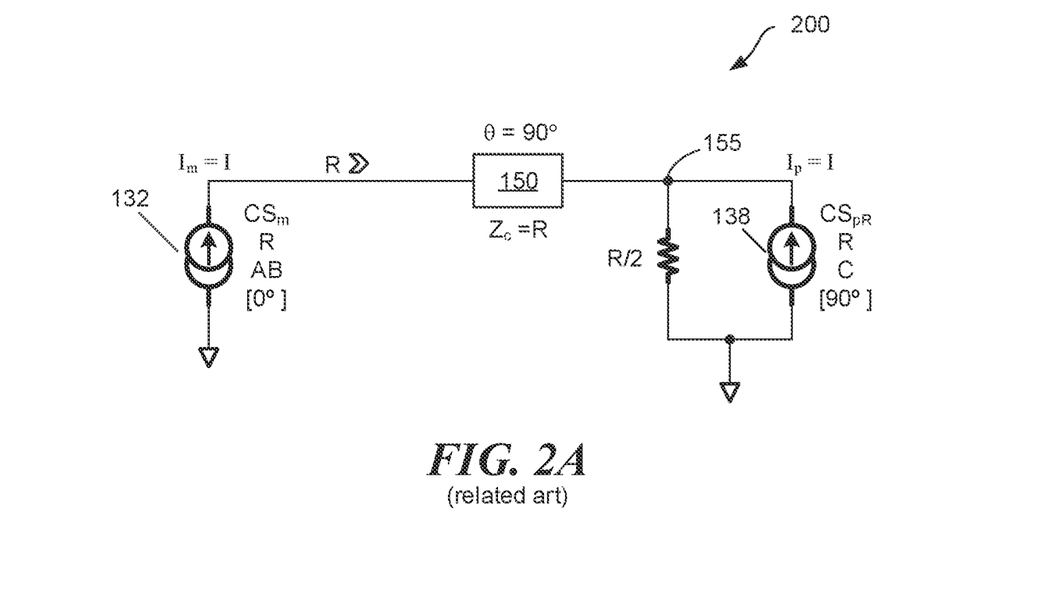
FIG. 2A illustrates a circuit model for a symmetrical Doherty amplifier when a main amplifier and peaking amplifier are fully active according to various embodiments described herein.

Operational aspects of the Doherty amplifier 100 are illustrated in further detail in FIG. 2A, FIG. 2B, FIG. 3, and FIG. 4. FIG. 2A illustrates a circuit model 200 for the Doherty amplifier 100, assuming the Doherty amplifier 100 is a symmetrical amplifier, when the main amplifier 132 and peaking amplifier 138 are fully active according to various embodiments described herein. In this state, the main amplifier 132 operates in class AB mode, and the impedance-matching component 142 can be modeled as a current source, $CS_m$, having an internal impedance R that provides no phase delay to the amplified signal. The peaking amplifier 138 operates in class C mode. The impedance-matching component 144 and the phase delay of the power coupler 110 can be modeled as a second current source, $CS_p$, having an internal impedance R that provides a 90-degree phase delay to amplified signals. The impedance inverter 150 can be modeled as a quarter-wavelength transmission line having a characteristic impedance of R that provides a phase delay of 90 degrees for a carrier wave of a signal, for example. According to some embodiments, a load driven by the Doherty amplifier 100 may have an impedance of R/2.

The phase delays described herein are delays for a carrier wave of an RF signal that is modulated to encode information onto the carrier wave. For example, a carrier wave may oscillate at a frequency having a value in a range between 0.7 gigahertz (GHz) and 7 GHz, depending on what communication protocol is being used (e.g., 2G, 3G, 4G, etc.), and a phase delay is a delay in phase for a carrier wave for the relevant communication protocol.

The main amplifier 132 and the peaking amplifier 138 can be designed for a particular carrier frequency and communications protocol. As one example, an amplifier configured to handle signals for 4G communications may be designed for a carrier frequency of 2.6 GHz, and the phase delays of the amplifier components are relative to 2.6 GHz. As another example, an amplifier configured to handle signals for 4G communications may be designed for a carrier frequency of 1.9 GHz according to another protocol, and the phase delays of amplifier components are relative to 1.9 GHz.

When both the main amplifier 132 and the peaking amplifier 138 are active and driving a load of R/2 with approximately equal amounts of current I, as depicted in FIG. 2A, straightforward calculations show that the main amplifier 132 sees an impedance R at its output, as indicated by the chevron symbol in FIG. 2A. This is referred to as a "1:1 load" condition for the Doherty amplifier 100. This impedance value can be calculated in a two-step process. First, the impedance seen looking into the combining node 155 from the impedance inverter 150 is calculated. Second, the impedance looking into the combining node 155 is transformed according to the property of the quarter-wavelength impedance inverter 150 to find an impedance (in this case R) looking into the impedance inverter 150.

Figure 2B:
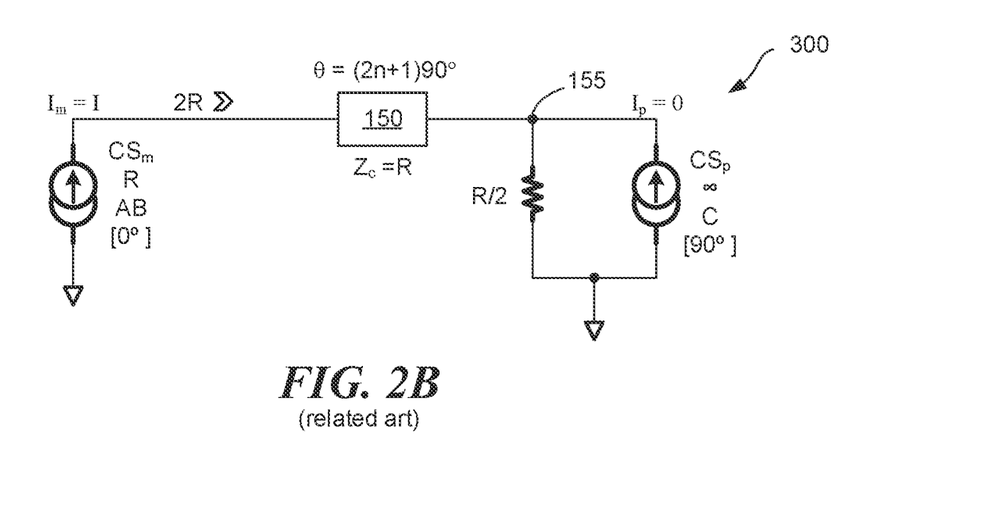
FIG. 2B illustrates a circuit model for a symmetrical Doherty amplifier when a main amplifier is active and a peaking amplifier is idle according to various embodiments described herein.

FIG. 2B illustrates a circuit model 300 for a symmetrical Doherty amplifier 100 when the main amplifier 132 is active and the peaking amplifier 138 is idle according to various embodiments described herein. When an input RF signal to be amplified by the Doherty amplifier 100 falls below a threshold value, the peaking amplifier 138 becomes idle (e.g., turns off, does not amplify) and can be modeled essentially as an open circuit. For this model, the impedance of the peaking amplifier 138 changes from R to an infinite value. Recalculating impedances looking into the combining node 155 and into the impedance inverter 150 from the main amplifier 132 shows that the impedance value seen looking into the impedance inverter 150 rises to 2R, as indicated by the chevron symbol in FIG. 2B. This operating condition is referred to as the "2:1 load" condition of the Doherty amplifier. In this case, the impedance R of the main amplifier 132 is no longer matched with the 2R load. Such a mismatch can lead to signal reflections, a high value of return loss, and inefficient operation of the Doherty amplifier 100.

Thus, the impedance seen by the main amplifier 132 depends in part on the state of the peaking amplifier 138. The variation in the impedance seen by the main amplifier 132 is referred to as "load modulation." Load modulation adversely affects the power-handling capability of the Doherty amplifier 100 and the RF fractional bandwidth ($\Delta\omega/\omega_o$) of the Doherty amplifier 100. Mismatches in impedance cause power reflections, and such reflections may limit the operating range of the main amplifier 132 to that which is appreciably lower than if not for the power reflections. The amount of reflected power may further depend on frequency, and changes in reflected power with frequency can take an amplifier out of compliance with a specification more quickly (e.g., resulting in a narrower bandwidth) than if there were no reflected power.

Figure 3:
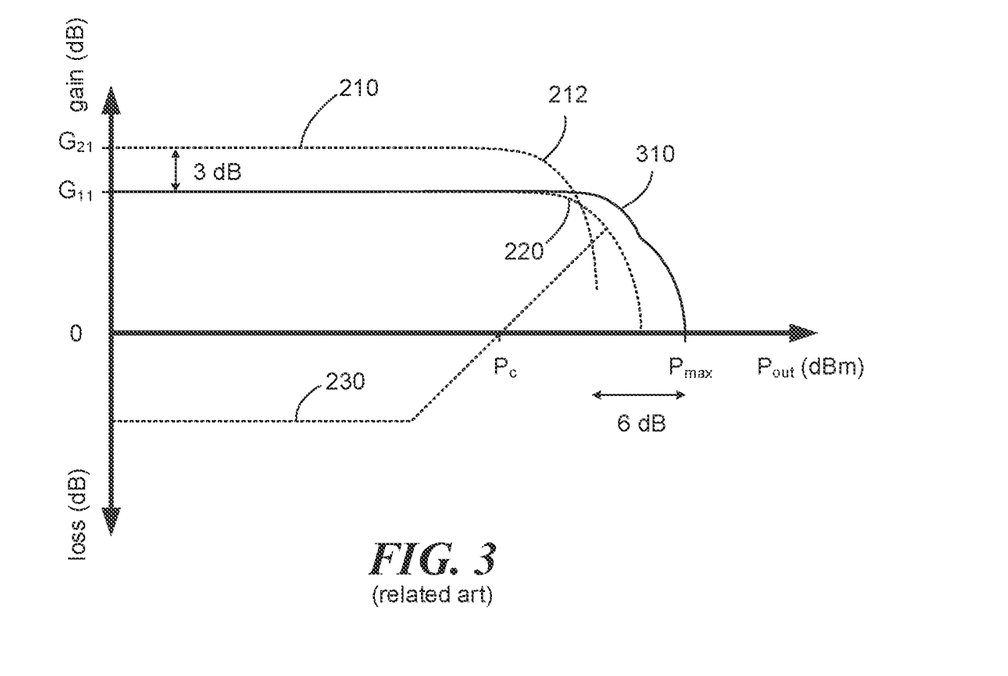
FIG. 3 illustrates gain as a function of output power for a Doherty amplifier according to various embodiments described herein.
Figure 4:
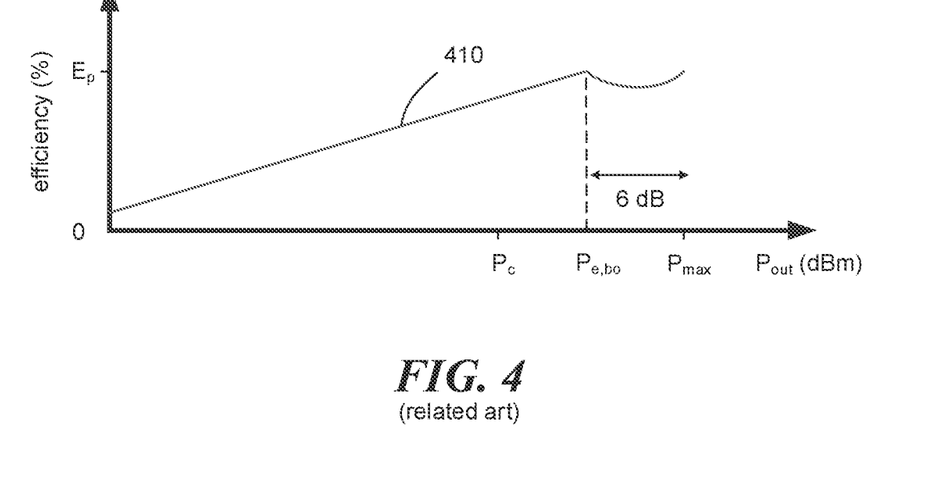
FIG. 4 illustrates and example efficiency curve of a Doherty amplifier as a function of output power according to various embodiments described herein.

Certain aspects of the gain and efficiency dynamics of the Doherty amplifier 100 are illustrated in FIGS. 3 and 4. In FIG. 3, a first gain curve 210 depicts gain of the main amplifier 132 as a function of output power Pout, when the peaking amplifier 138 is idle or off. The curve 210 corresponds to the so-called 2:1 load condition. The peaking amplifier 138 is typically idle at low input signal power levels, such as input signal power levels that do not saturate the main amplifier 132. These low input power signal levels correspond to output power levels that are up to about 6 dB below a peak output power level of the Doherty amplifier 100. These low input power level signals can be amplified by the main amplifier 132, with the peaking amplifier 138 being idle.

The peaking amplifier 138 begins to amplify the input signal and contribute to the output of the Doherty amplifier 100 at about the power-compression point $P_c$ of the main amplifier 132. The gain of the main amplifier 132 will begin to saturate and go into "compression" at the power-compression point $P_c$. The saturation and compression of the main amplifier 132 is indicated by the fall-off region 212 in FIG. 3. In saturation, the main amplifier 132 exhibits nonlinear amplification, resulting in distortion. The power-compression point $P_c$ for the main amplifier 132 will depend upon its design (e.g., the size of active areas in the transistor(s) of the amplifier) and can vary among amplifiers used in communication systems. The power-compression point $P_c$ can be larger or smaller than the example shown in FIG. 3.

The peaking amplifier 138 begins to amplify the input signal and contribute to the gain and output of the Doherty amplifier 100 at the power-compression point $P_c$. An example gain curve 230 for the peaking amplifier 138 is also depicted in FIG. 3. The peaking amplifier 138 helps to compensate for the saturation of the main amplifier 132 at higher powers, until the peaking amplifier 138 begins to saturate, go into compression, and fall off. The peaking amplifier 138 can extend the range of linear amplification for the Doherty amplifier 100.

FIG. 3 includes a second gain curve 220 for when both the main amplifier 132 and the peaking amplifier 138 are active and amplifying. The gain curve 220 corresponds to the 1:1 load condition. When the peaking amplifier 138 is active, it effectively adds load impedance to the main amplifier 132 (effectively reducing the gain of the main amplifier 132 by about 3 dB). FIG. 3 also depicts a gain curve 310 as a function of output power for the Doherty amplifier 100. The gain curve 310 is a result of the combined actions of the main amplifier 132 and peaking amplifier 138 as described above.

An example drain efficiency curve 410 for the Doherty amplifier 100 is illustrated in FIG. 4. The efficiency of the Doherty amplifier 100 rises to a peak efficiency $E_p$ that occurs approximately when the gain of the peaking amplifier 138 has reached its highest value. Ideally in a Doherty amplifier, the peak efficiency $E_p$ would occur at about 6 dB below the maximum output power $P_{max}$, in a region referred to as the "output power back-off" (OBO, though sometimes denoted OPO) region. The efficiency falls below the peak value $E_p$ for output power levels below the 6 dB OBO point in a region where the peaking amplifier is transitioning from low gain levels (where the peaking amplifier primarily loads the main amplifier) to its maximum gain (refer to FIG. 3).

In practice, the peak efficiency for the Doherty amplifier 100 does not occur at 6 dB OBO, because of several effects present in conventional Doherty amplifiers. A first effect relates to isolation of the peaking amplifier 138 in power back-off. The peaking amplifier 138 can be modeled as having infinite impedance (e.g., an open circuit) in back-off. However, in practical applications, the impedance is very large but finite at 6 dB OBO. Further, the impedance inverter 150 and/or output matching elements 142, 144 can exhibit losses which may not be insignificant. Additionally, the main amplifier 132 and the peaking amplifier 138 typically have non-ideal I-V curves and/or knee voltages. These effects, among others, can cause the peak efficiency of the Doherty amplifier 100 to occur at less than 6 dB OBO (e.g., about 5 dB OBO or less). This, in turn, causes the efficiency of the Doherty amplifier 100 to be further reduced as compared to that shown in FIG. 4 in a region of about 8 dB OBO to about 9 dB OBO.

Load modulation can adversely affect power handling and bandwidth capability of a Doherty amplifier. Due in part to load modulation, Doherty amplifiers exhibit a peak efficiency in a region between about 5 dB and 6 dB OBO. As the same time, newly-developed signal protocols for communications systems increase the peak-to-average power ratio (PAPR) in communication signals to handle large data rates with high spectral efficiency. As a result, it may be necessary to operate Doherty amplifiers in a higher maximum output power $P_{max}$ region (e.g., 7 dB OBO or more) for a large extent of the overall operating time. The efficiency of conventional Doherty amplifiers is typically reduced—and reducing—in these higher OBO regions of operation.

A number of different low-load-modulation, broadband multiclass Doherty power amplifiers are described below. An example low-load-modulation power amplifier can exhibit peak efficiency at back-off power margins of 6 dB or more and improved bandwidth capability as compared to conventional Doherty amplifiers. The main amplifier in the Doherty amplifiers described below experiences appreciably less load modulation than in the Doherty amplifier 100 described above.

Figure 5:
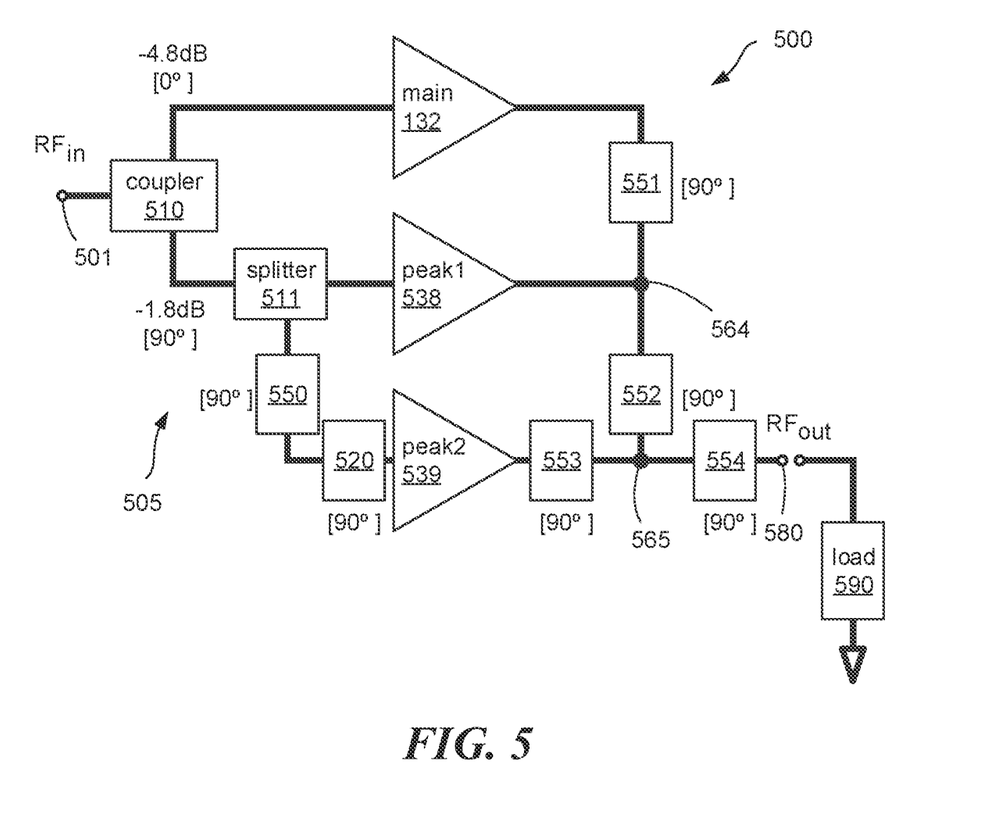
FIG. 5 illustrates a schematic for an example low-load-modulation broadband power amplifier according to various embodiments described herein.

An example of a low-load-modulation power amplifier 500 ("power amplifier 500") is depicted in FIG. 5. The power amplifier 500 is provided as a representative example in FIG. 5 for the purposes of discussion. Thus, the structure and arrangement of the power amplifier 500 is provided by way of example only. The concepts described herein are applicable to variations of the power amplifier 500, including other types of amplifiers. In some cases, one or more of the circuit elements shown in FIG. 5 can be omitted or replaced, and one or more additional circuit elements not shown in FIG. 5 can be added or included, without departing from the concepts described herein.

As shown in FIG. 5, the power amplifier 500 includes a plurality of amplifiers operating in parallel on a received signal. The power amplifier 500 includes a main amplifier 132, a first peaking amplifier 538, and a second peaking amplifier 539, The amplifiers 132, 538, and 539 can operate in parallel based on a received RF input signal, $RF_{in}$. In one example, each amplifier 132, 538, 539 can be embodied as one or a plurality of integrated semiconductor transistors connected in parallel to amplify $RF_{in}$. The transistor or transistors can be formed using gallium nitride material(s), in one example, although the concepts are not limited to transistors formed using any particular semiconductor material(s) or manufacturing processes.

The power amplifier 500 also includes signal dividing circuitry 505. The signal dividing circuitry 505 includes a power coupler 510 and a power splitter 511, with the power splitter 511 being connected to one output port of the power coupler 510. The signal dividing circuitry 505 is not limited to this combination of signal dividing components, however, as other components and arrangements of components can be relied upon. The power coupler 510 can be embodied as a directional coupler configured to split the power of $RF_{in}$ between the circuit branch of the main amplifier and the circuit branch of the first and second peaking amplifiers 538 and 539. Thus, the $RF_{in}$ signal is received at an input terminal 501 of the power amplifier 500. The $RF_{in}$ signal is divided into parallel circuit branches by the signal dividing circuitry 505 and provided to the plurality of amplifiers 132, 538, 539. Other aspects of the signal dividing circuitry 505 are described in further detail below.

The power amplifier 500 also includes impedance inverters 550, 551, 552, and 553 coupled among the amplifiers 132, 538, and 539, a first combining node 564, and a second combining node 565. Particularly, the first impedance inverter 551 can be coupled between the main amplifier 132 and the first combining node 564. The second impedance inverter 552 can be coupled between the first combining node 564 and the second combining node 565. The third impedance inverter 553 can be coupled between the second peaking amplifier 539 and the second combining node 565.

The impedance inverters 550, 551, 552, and 553 can be embodied as quarter-wavelength transformers or transmissions lines, although other types of impedance inverters can be relied upon. Each impedance inverter 550, 551, 552, and 553 adds a 90 degree phase delay (or about a 90 degree phase delay, e.g., to within 10%) to a signal passing through it. Each impedance inverter 550, 551, 552, and 553 also transforms an impedance $Z_o$ at an output of the inverter to an impedance $Z_i$ at an input of the inverter based on a characteristic impedance $Z_c$ of the inverter according to the following relation $Z_i = Z_c^2/Z_o$.

The outputs of the amplifiers 132, 538, and 539 are combined at the combining nodes 564 and 565 and, ultimately, provided to an output terminal 580 of the power amplifier 500, as illustrated in FIG. 5. In some implementations, the output terminal 580 may be specified to connect to a load 590 having a specified impedance value $R_L$ (e.g., 50 ohms), though in some cases the impedance of the load 590 may be between 25 ohms and 100 ohms. In some implementations, the power amplifier 500 can also include an output impedance inverter 554 connected in series between the second combining node 565 and the output terminal 580 (e.g., located before or after the output terminal 580). The output impedance inverter 554 can be used to transform an output impedance to a desired value at the second combining node 565, to improve power transfer to the load.

As noted above, the power coupler 510 can be configured to divide the received $RF_{in}$ signal into a first signal that provided to the main amplifier 132 in a first circuit branch and a second signal that is provided to the splitter 511 in a second circuit branch. In one example, a power level of the first signal may have about one-third (⅓) the power of the received $RF_{in}$ signal (e.g., to within 10%) and have a same phase (e.g., to within 10%) as the received $RF_{in}$ signal. A power level of the second signal may have about two-thirds (⅔) the power of the received $RF_{in}$ signal (e.g., to within 10%) and have a phase that is 90-degrees (e.g., to within 10%) different from the phase of the received $RF_{in}$ signal. For phase relationships, relative phases of two signals are determined or referenced as compared to the phases of the carrier waves of the signals.

The power splitter 511 can be configured, in some cases, to divide power received at an input port into two outputs of equal power (e.g., to within 10%). The two outputs of the power splitter 511 are provided, respectively, to the first peaking amplifier 538 in a first peaking amplifier circuit branch and to the second peaking amplifier 539 in a second peaking amplifier branch. The power splitter 511 can be configured to provide the output signals with equal phases (e.g., to within 10%).

The impedance inverter 550 can be connected between one output of the power splitter 511 and an input to the second peaking amplifier 539. The input impedance inverter 550 can be configured to rotate the phase of a received signal by 90 degrees (e.g., to within 10%), so that the phase of a signal received by the second peaking amplifier 539 differs from a phase of a signal received by the first peaking amplifier 538 by at least 90 degrees. The input impedance inverter 550 can also "invert" the impedance (e.g., rotate the impedance on a Smith chart by 180 degrees to within 10%) between its output and input terminals. In some implementations, each of the impedance inverters 550, 551, 552, and 553 can delay the phase of a carrier wave by an amount between 85 degrees and 95 degrees.

According to some embodiments, the power amplifier 500 can also include an impedance-matching component 520. The impedance-matching component 520 can add an additional phase delay of 90 degrees (e.g., to within 10%) in the circuit branch containing the second peaking amplifier 539. As shown in FIG. 5, the impedance-matching component 520 can be located before the second peaking amplifier 539 (or, in some cases, after the second peaking amplifier 539). In other examples, the impedance-matching component 520 can be omitted from the power amplifier 500, and the first impedance inverter 550 can be replaced with a half-wavelength transformer configured to adds 180 degrees of phase delay. With the additional phase shift, the signals from the second peaking amplifier 539 and the second impedance inverter 552 can constructively combine in phase at the second combining node 565.

In other examples, a power coupler can be used in place of the power splitter 511. In this case, the power coupler could be configured to divide power equally to two output ports and delay the phase of the carrier wave provided to the second peaking amplifier 539 by 90 degrees (to within 10%) with respect to the phase of the carrier wave provided to the first peaking amplifier 538. In this case, the input impedance inverter 550 or the impedance-matching component 520 may be omitted in the circuit branch containing the second peaking amplifier 539.

In some cases, other power dividing ratios and phase relationships can be relied upon in the power amplifier 500. Other power dividing ratios and phase relationships can be implemented after the power coupler 510. Additionally or alternatively, other power dividing ratios and phase relationships can be implemented after the power splitter 511. As described in further detail below, other power ratios can be used to obtain different load-modulation values for the main amplifier 132.

One or more phase-delay components (e.g., impedance inverters, phase-matching components, phase delay lines, etc.) can be connected in the parallel circuit branches after the power-dividing elements to implement other phase relationships. The phase-delay components can be configured such that the first peaking amplifier 538 receives a signal that is shifted in phase by ((2N+1)90°), to within 10°, from a signal received by the main amplifier 132, wherein N is an integer (|N|=0, 1, 2, ... ). The phase-delay components can also be configured such that the second peaking amplifier 539 receives a signal that is ((2N+1)90°) or (N×180°), to within 10°. Further, depending on whether the additional 90° phase shift is located before or after the second peaking amplifier 539, the signal received by the second peaking amplifier 539 can be different in phase as compared to the signal received by the first peaking amplifier 538.

In one preferred embodiment, the phase of a portion of the signal $RF_{in}$ received by the first peaking amplifier 538 is 90° different from a phase of a portion of the signal $RF_{in}$ received by the main amplifier 132, and a phase of a portion of the signal $RF_{in}$ received by the second peaking amplifier 539 is 90° or 180° different from a phase of a portion of the signal $RF_{in}$ received by the first peaking amplifier 538 depending on whether the additional 90° phase shift is located before or after the second peaking amplifier 539. Expressed alternatively, a carrier wave of the signal travelling from the power splitter 511 (or coupler if used instead of the power splitter 511) to the second combining node 565 through the second peaking amplifier 539 undergoes an additional phase delay of N×180 degrees (|N|=0, 1, 2, ... ), to within 10%, as compared to the carrier wave of the signal travelling from the power splitter 511 to the second combining node 565 through the first peaking amplifier 538.

In some embodiments, the impedance inverter 551 is coupled between an output of the main amplifier 132 and the first combining node 564, and the second impedance inverter 552 is coupled between the first combining node 564 and the second combining node 565. As shown in FIG. 5, no impedance inverter is connected between the first peaking amplifier 538 and the first combining node 564. Additionally, the impedance inverter 553 is connected or coupled between the second peaking amplifier 539 and the second combining node 565. The coupler 510 can introduce a phase delay into the circuit branch that includes the first peaking amplifier 538 that compensates for a phase delay (e.g., 90 degrees to within 10%) introduced by the impedance inverter 551, so that signals from the main amplifier 132 and the first peaking amplifier 538 combine essentially in phase at the first combining node 564. An additional phase delay (e.g., 90 degrees to within 10%) can be added in circuit branch containing the second peaking amplifier 539 to compensate for the phase delay introduced by the impedance inverter 553. The first impedance inverter 551, second impedance inverter 552, and third impedance inverter 553 can each invert impedances between their output and input terminals based on their characteristic impedances.

In some implementations, the impedance inverter 551, the impedance inverter 552, or both can be embodied in a corresponding impedance-matching component. For example, the functionality of the impedance inverter 551 can be incorporated in an impedance-matching component located between the main amplifier 132 and the first combining node 564.

In some implementations, the power amplifier 500 can be modified to additionally include one or more impedance-matching components located between the illustrated components, to transform an impedance from a downstream component's input impedance to an upstream component's output impedance, similar to the impedance-matching components 122, 124, 142, 144 depicted in FIG. 1. For example, the power amplifier 500 can include an impedance-matching component connected to the input of one or more of the main amplifier 132, the first peaking amplifier 538, and the second peaking amplifier 539. Additionally or alternatively, the power amplifier 500 can include an impedance-matching component connected to the output of one or more of the main amplifier 132, the first peaking amplifier 538, and the second peaking amplifier 539. Although the circuit illustrated in FIG. 5 shows no phase delay between the first peaking amplifier 538 and the first combining node 564, a 180-degree phase delay can be included between the first peaking amplifier 538 and the first combining node 564 in other examples.

In operation, the main amplifier 132 of the power amplifier 500 is configured to always operate in an active amplifying state when the power amplifier 500 is powered on. The received $RF_{in}$ signal at the input terminal 501 can be divided, equally or unequally, into three portions that are provided to the main amplifier 132, the first peaking amplifier 538, and the second peaking amplifier 539. The main amplifier 132 can be biased to amplify the received portion of $RF_{in}$ according to a first amplification class (e.g., class A, class B, or class AB). The first peaking amplifier 538 can be biased to amplify the received portion of $RF_{in}$ according to a second amplification class (e.g., class C). The second peaking amplifier 539 can also be biased to amplify the received portion of $RF_{in}$ according to a second amplification class (e.g., class C).

The first peaking amplifier 538 and the second peaking amplifier 539 can be biased as idle and non-amplifying when $RF_{in}$ is below a threshold value and enter an active, amplifying state when $RF_{in}$ exceeds the threshold value. The threshold value can be a signal level at which the main amplifier 132 begins to go into compression (e.g., a power-compression point $P_c$ as described in connection with FIG. 3). In some implementations, the power-compression point $P_c$ for the main amplifier 132 of the low-load-modulation power amplifier 500 will depend upon the design of the main amplifier 132 (e.g., the size of active areas in the transistors). As examples, the power-compression point could be any value from 1 Watt (30 dBm) to 100 Watts (50 dBm) for an amplifier used in a communication system. Smaller or larger values of the power-compression point can occur in other applications.

In operations above the power-compression point $P_c$, the first peaking amplifier 538 and/or second peaking amplifier 539 begin to amplify their received portions of $RF_{in}$. The output power of the peaking amplifiers 538 and 539 will increase until going into compression. Each of the peaking amplifiers 538 and 539 is considered to be fully amplifying at a point immediately prior to, or within 5% or 10% the linear range of, the power-compression point of the amplifier. According to some implementations, the first peaking amplifier 538 and the second peaking amplifier 539 turn on simultaneously (e.g., at a same threshold value of $RF_{in}$) and reach their power-compression points simultaneously (e.g., at a same signal level of $RF_{in}$). In other embodiments, the first peaking amplifier 538 and the second peaking amplifier 539 turn on in a staggered manner, at different threshold values of $RF_{in}$, and may reach their power-compression points at different signal levels of $RF_{in}$. The point at which the first peaking amplifier 538 and second peaking amplifier 539 begin to amplify their portions of the received signal can be set by respective biasing voltages applied to the amplifiers.

Figure 6:
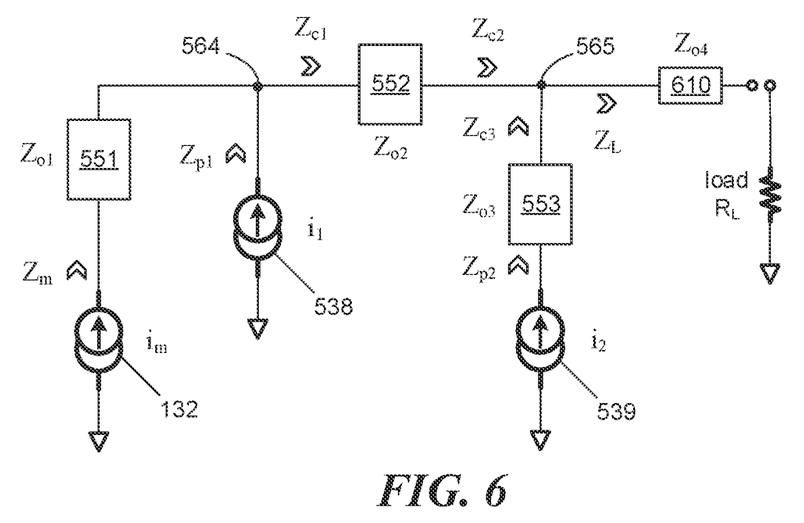
FIG. 6 illustrates a circuit model for an example low-load-modulation broadband power amplifier in a fully-amplifying state according to various embodiments described herein.

FIG. 6 illustrates a circuit model for an example low-load-modulation broadband power amplifier 500 in a fully-amplifying state according to various embodiments described herein. The impedance seen by the main amplifier 132 during operation when all amplifiers are fully amplifying can be determined from the circuit model illustrated in FIG. 6. In the illustrated example, an output impedance inverter 610 or impedance-matching network can be added between a load $R_L$ and the second combining node 565. For example, an output impedance inverter 610 having a characteristic impedance $Z_{o4}$ can be included to transform the impedance of a load $R_L$ to a value $Z_L$ that provides improved power delivery (e.g., less return loss and higher efficiency) from the low-load-modulation power amplifier 500. In some implementations, the output impedance inverter 610 or impedance-matching network can be included in the same package with the other components of the low-load-modulation power amplifier 500. In other cases, the impedance inverter 610 or impedance-matching network can be external to the low-load-modulation power amplifier 500.

In the illustrated embodiment, the impedance inverter 610 has a characteristic impedance $Z_{o4}$, the impedance inverter 551 has a characteristic impedance $Z_{o1}$, the impedance inverter 552 has a characteristic impedance $Z_{o2}$, and the impedance inverter 553 has a characteristic impedance $Z_{o3}$. The main amplifier 132 is modeled as a first current source that delivers a current $i_m$ in its fully-amplifying state. The first peaking amplifier 538 is modeled as a second current source that delivers a current $i_1$ in its fully-amplifying state, and the second peaking amplifier 539 is modeled as a third current source that delivers a current $i_2$ in its fully-amplifying state. Impedance values seen looking into nodes or impedance inverters are indicated by chevrons. For example, an impedance value seen by the main amplifier 132 looking into the impedance inverter 551 is represented as $Z_m$.

The impedance values seen at the output of each amplifier can be found by solving for voltage and current at the first combining node 564 and the second combining node 565. The impedance $Z_{m,full}$, seen at the output of the main amplifier 132 when all amplifiers are fully amplifying, can be expressed as follows:

$$Z_{m,full} = \frac{Z_{O1}^2}{Z_{O2}^2} \frac{i_m(i_m + i_1 + i_2)}{(i_m + i_1)^2} Z_L, \tag{1}$$

where $Z_{o1}$ is the characteristic impedance of the first impedance inverter 551 and $Z_{o2}$ is the characteristic impedance of the second impedance inverter 552.

When the low-load-modulation power amplifier 500 is fully backed off, the peaking amplifiers 538 and 539 are not amplifying, and the circuit branches of the peaking amplifiers 538 and 539 can be approximated as open circuits. In a fully backed-off state, the impedance $Z_{m,bo}$ seen at the output of the main amplifier 132 can be expressed as follows:

$$Z_{m,bo} = \frac{Z_{O1}^2}{Z_{O2}^2} Z_L. \tag{2}$$

The impedance $Z_{p1}$ seen by the first peaking amplifier 538 in a fully-on state can be expressed as follows:

$$Z_{p1} = \frac{Z_{O2}^2}{Z_L} \frac{(i_m + i_1)^2}{i_m(i_m + i_1 + i_2)}. \tag{3}$$

The impedance $Z_{p2}$ seen by the second peaking amplifier 539 in a fully-on state can be expressed as follows:

$$Z_{p2} = \frac{Z_{O3}^2}{Z_L} \frac{i_2}{(i_m + i_1 + i_2)}. \tag{4}$$

According to one aspect of the embodiments, the power amplifier 500 can be designed such that both peaking amplifiers 538 and 539 see the same impedance values at their outputs. When the two peaking amplifiers 538 and 539 see the same impedance, a same design and/or same impedance-matching components can be used for both peaking amplifiers 538 and 539, which can simplify the low-load modulation, broadband amplifier 500. The same impedance will be seen by both amplifiers 538 and 539 if the impedance of EQ. 3 is set equal to the impedance of EQ. 4 ($Z_{p1}=Z_{p2}$). The impedances can be made equal (or the same to within 10%) by design of the characteristic impedance $Z_{o3}$ of the third impedance inverter 553 and the characteristic impedance Zoe of the second impedance inverter 552 according to substantial satisfaction (to within 10%) of the following expression:

$$Z_{o3} = Z_{o2} \frac{(i_m + i_1)}{\sqrt{i_1 i_2}}. \tag{5}$$

In some implementations, the amount of maximum current (or maximum power) delivered by the first and second peaking amplifiers 538 and 539 when fully amplifying can be essentially equal (e.g., $i_1 \approx i_2 \approx i_p$). However, the invention is not limited to having equal outputs from the two peaking amplifiers 538 and 539, and unequal outputs can be used. Additionally or alternatively, the characteristic impedance of the first impedance inverter 551 and the characteristic impedance as the second impedance inverter 552 can be designed according to the following expression:

$$Z_{o1} = \frac{Z_{o2}^2}{Z_L}. \tag{6}$$

When the maximum currents or power levels in the peaking amplifiers 538 and 539 are essentially equal (e.g., $i_1 \approx i_2 \approx i_p$), defining a current ratio $r = i_p / i_m$, and using EQ. 5 and EQ. 6, then EQ. 1 and EQ. 3 can be rewritten as follows:

$$Z_{m,full} = \frac{(2r+1)}{(r+1)^2} \frac{Z_{O2}^2}{Z_L}, \text{ and} \tag{7}$$

$$Z_{p1} = Z_{p2} = \frac{(r+1)^2}{r(2r+1)} \frac{Z_{O2}^2}{Z_L}. \tag{8}$$

As a first example embodiment under the foregoing conditions, $i_p = i_m$ so that $r=1$. The characteristic impedance Zoe can be designed such that $Z_{o2} = (50\Omega \times Z_L)^{1/2}$. For such an embodiment, the main amplifier 132 sees a load impedance in a fully-on state of 37.5 and sees a load impedance in a backed-off state of 50Ω, which represents a load-modulation ratio $M_R = Z_{m,bo} / Z_{m,full}$ of approximately 1.33. For comparison, the modulation ratio for the main amplifier in a conventional symmetric Doherty amplifier (for which the main and peaking amplifiers output essentially a same maximum amount of current or power) would be $M_R = 2.0$. A lower modulation ratio for the low-load-modulation power amplifier 500 results in less power being reflected within the power amplifier 500, facilitating operation at higher power levels and at a larger bandwidths than conventional Doherty amplifiers. Additionally, each peaking amplifier 538 and 539 sees a same load impedance of approximately 66.7Ω in a fully-on state.

As a second example embodiment, $r \approx 1.62$. For such an embodiment, $M_R \approx 1.62$. The peaking amplifiers 538 and 539 see an output impedance of 50Ω, and the main amplifier 132 sees an output impedance that varies from 50Ω at back-off to 30.9Ω when the amplifier 500 is operating in a fully-amplifying state. Additionally, the relative location dP of the peak back-off efficiency point (indicated as $P_{e,bo}$ in FIG. 4) for a low-load-modulation, broadband power amplifier 500 expressed in dB from a peak output power from the amplifier 500 can be found from the following expression:

$$dP = 10\log \frac{1}{M_R i_t / i_m}, \tag{9}$$

for which $i_1$ represents the total output current of the amplifier ($i_m + i_1 + i_2$) in a fully-amplifying state. For the example embodiment above in which $r \approx 1.62$, the location of the peak efficiency is approximately 8.4 dB down from peak output power (−8.4 dB).

For comparison, the modulation ratio for the main amplifier in a conventional asymmetric Doherty amplifier (in which the single peaking amplifier outputs approximately 3.24 times as much maximum current as the main amplifier) would be $M_R = 4.24$ and the location of peak efficiency at back-off would be −12.5 dB. For the low-load-modulation power amplifier 500, the modulation ratio $M_R$ can be kept significantly lower than the modulation ratio of the conventional Doherty amplifier, as the amount of power handled by the peaking amplifiers is increased. The reduction in modulation ratio for the low-load-modulation power amplifier 500 can significantly improve the bandwidth of the amplifier.

Another consideration is that, for the same modulation ratio as compared to a conventional amplifier, the low-load-modulation power amplifier 500 has a peak efficiency located at a much larger back-off point. For example, for a modulation ratio $M_R = 2$, the peak efficiency at back-off for the low-load-modulation power amplifier 500 is approximately −10.7 dB, as compared to −6 dB for a conventional Doherty amplifier. A larger back-off amount for peak efficiency is desirable in communication systems that operate with higher peak-to-average power ratios. In some implementations, a relative location of the peak back-off efficiency for a low-load-modulation amplifier of the present embodiments is between −7 dB and −14 dB.

As can be appreciated from the foregoing analysis, the load-modulation ratio $M_R$ and the location of peak efficiency at back-off dP can be controlled by adjusting amounts of maximum current or power delivered by the main amplifier 132 and the peaking amplifiers 538 and 539 in the power amplifier 500. According to some embodiments, the first peaking amplifier 538 and the second peaking amplifier 539 are configured to output a same amount of maximum power or current to within 10%. In some cases, the main amplifier 132 is configured to output the same amount of maximum power or current as the first peaking amplifier 538 to within 10%. In other cases, the main amplifier 132 is configured to output an amount of maximum power or current that differs by at least 20% as compared to an amount of maximum power or current output by the first peaking amplifier 538. According to some embodiments, the first peaking amplifier 538 is configured to output a first amount of maximum power and the second peaking amplifier 539 is configured to output a second amount of maximum power that is different from the first amount of maximum power by at least 20%.

In some embodiments, it can be beneficial to select values of characteristic impedances for the impedance inverters 551, 552, 553 to have a particular value or to be proportional to a load $R_L$ that is driven by the low-load-modulation, broadband power amplifier 500. For example, the selection of characteristic impedance values according to EQ. 5 can yield a power amplifier 500 in which both peaking amplifiers 538 and 539 see essentially a same impedance at their outputs. In some embodiments, $Z_{o1}$ can be selected to have a value equal to $R_L$ (to within 10%) and $Z_{o2} = (R_L Z_L)^{1/2}$ (to within 10%). $Z_L$ can be an impedance seen after the second combining node 565 (e.g., a transformed impedance of the load $R_L$). In some embodiments, $R_L$ can have a real impedance value between 5 ohms and 100 ohms. In some embodiments, $R_L$ has a real value of impedance between 40 ohms and 60 ohms.

Figure 7:
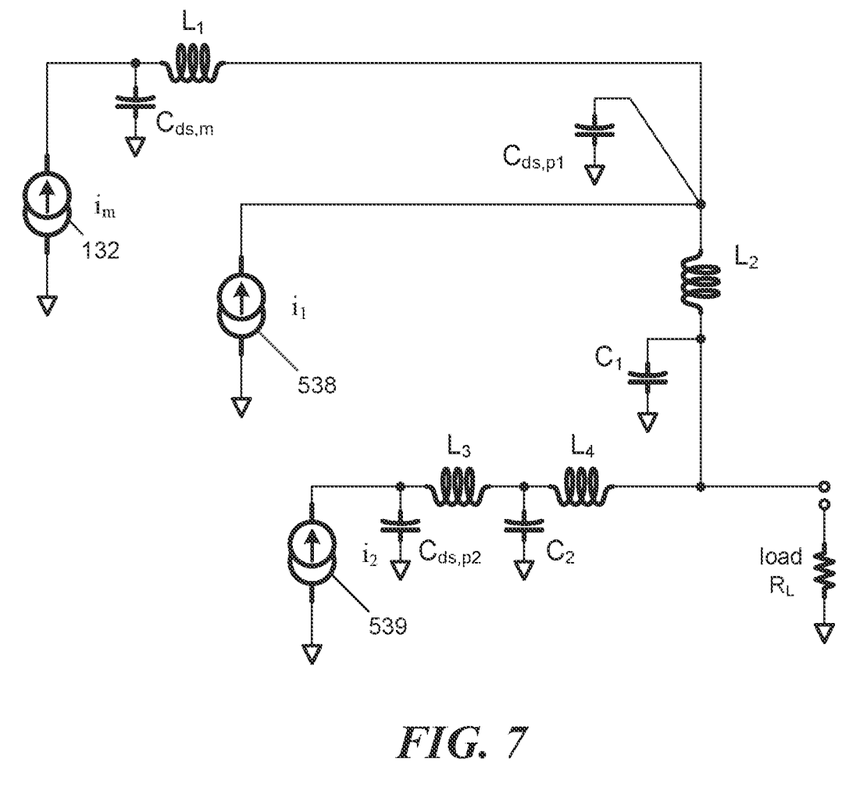
FIG. 7 illustrates a circuit model for an example low-load-modulation broadband power amplifier in which parasitic capacitances can be incorporated into impedance inverters according to various embodiments described herein.

FIG. 7 illustrates a circuit model for an example low-load-modulation broadband power amplifier 500 in which parasitic capacitances can be incorporated into impedance inverters according to various embodiments described herein. In FIG. 7, parasitic capacitances $C_{ds,m}$, $C_{ds,p1}$, and $C_{ds,p2}$ have been incorporated as part of the impedance inverters 551, 552, and 553. For example, the parasitic drain capacitance $C_{ds,m}$ at the output of the main amplifier 132, the first inductor $L_1$, and at least a portion of parasitic drain capacitance $C_{ds,p1}$ at the output of the first peaking amplifier 538 are representative of the first impedance inverter 551. Additionally, at least a portion of parasitic drain capacitance $C_{ds,p1}$ at the output of the first peaking amplifier 538, a second inductor $L_2$, and a first capacitor $C_1$ are representative of the second impedance inverter 552. Additionally, the parasitic drain capacitance $C_{ds,p2}$ at the output of the second peaking amplifier 539, a third inductor $L_3$, a second capacitor $C_2$, and a fourth inductor $L_4$ are representative of the third impedance inverter 553. The inductors $L_1$-$L_4$ and capacitors $C_1$-$C_2$ can be lumped elements (discrete inductors and discrete capacitors), distributed elements (e.g., formed from integrated transmission lines), or a combination of lumped and distributed elements. By incorporating parasitic capacitances into the impedance inverters, a low-load-modulation, broadband power amplifier 500 can be made more compact and/or with fewer parts to assemble.

Figure 8:
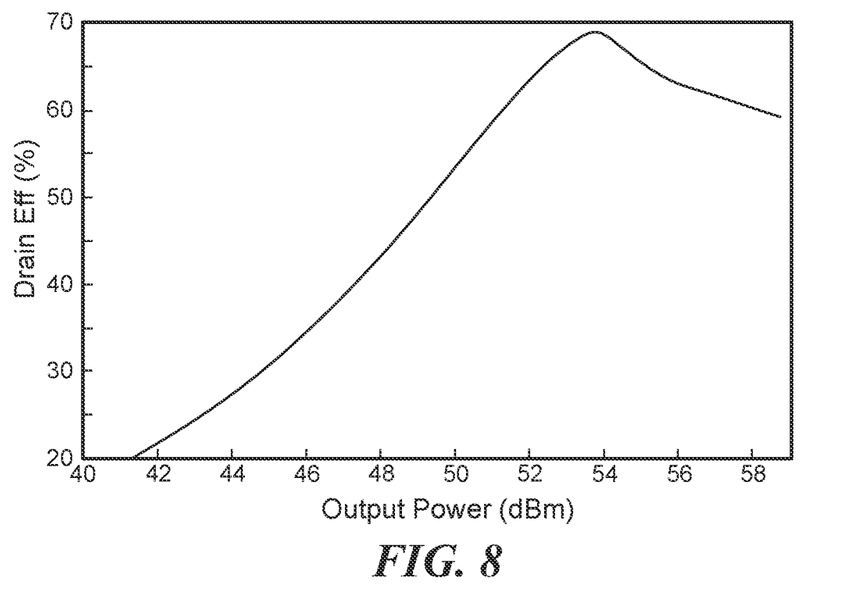
FIG. 8 illustrates plots of drain efficiency for an example low-load-modulation broadband power amplifier according to various embodiments described herein.

FIG. 8 illustrates an example drain efficiency curve for a low-load-modulation, broadband power amplifier 500 at approximately mid-band (approximately 850 MHz in this example). The amplifier included three gallium-nitride material, high-electron-mobility transistors for the main amplifier 132 and the peaking amplifiers 538 and 539. The drain bias was 50 V for each amplifier, and the bias current for the power amplifier 500 was approximately 450 mA. A gate voltage for the first peaking amplifier 538 was biased at −3.3 V, and a gate voltage for the second peaking amplifier 539 was biased at −4.7 V. The example curve shows that a peak drain efficiency of more than 68% can occur at approximately 6 dB output power back-off. Drain efficiency is calculated as a ratio of RF power output from the amplifier to DC power input. By varying the carrier frequency, it was observed that the peak drain efficiency can be maintained in excess of 68% over a frequency range of approximately 110 MHz. These results suggest that the fractional bandwidth ($\Delta\omega/\omega_o$) for the power amplifier 500 is better than 13%.

Figure 9:
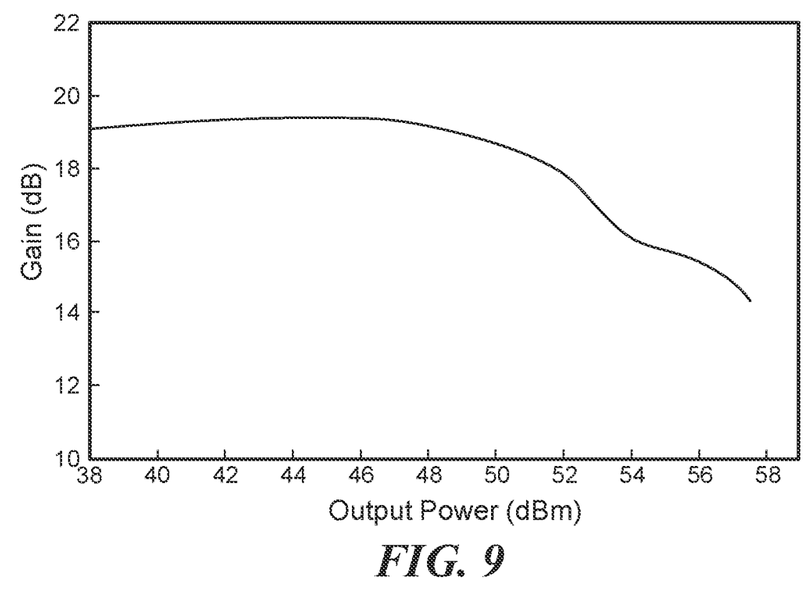
FIG. 9 illustrates a plot of gain for an example low-load-modulation broadband power amplifier according to various embodiments described herein.

FIG. 9 plots amplifier gain as a function of output power for the example power amplifier 500 (and as shown in connection with FIG. 8) for a carrier signal at mid-band (approximately 850 MHz). The 1 dB gain compression point is at approximately 50.8 dBm output power (approximately 120 Watts). Gain in excess of 18 dB can be maintained out to 51.8 dBm (over 150 Watts). Additionally, results obtained at different carrier frequencies show that gain in excess of 18 dB can be achieved for output power levels up to approximately 51 dBm over a bandwidth of approximately 110 MHz. These results show good linearity at high output powers over a broad bandwidth.

The results in FIGS. 8 and 9, over a range of different carrier frequencies, indicate additional figures of merit for the low-load-modulation, broadband power amplifier 500 of the embodiments. In the power amplifier 500, peak output powers up to 57 dBm (501 Watts) can be produced. For an average output power of approximately 50 dBm, drain efficiency in excess of 50% can be achieved at mid-band. Additionally, gain values in excess of 15 dB can be maintained over a carrier frequency range greater than 150 MHz for a mid-band frequency of approximately 850 MHz, representing a fractional bandwidth of approximately 18%. For a comparable conventional Doherty amplifier, the fractional bandwidth is typically about 6%. Accordingly, the low-load-modulation power amplifier 500 can improve the fractional bandwidth for an RF amplifier by approximately a factor of 3 as compared to a conventional Doherty amplifier.

Figure 10:
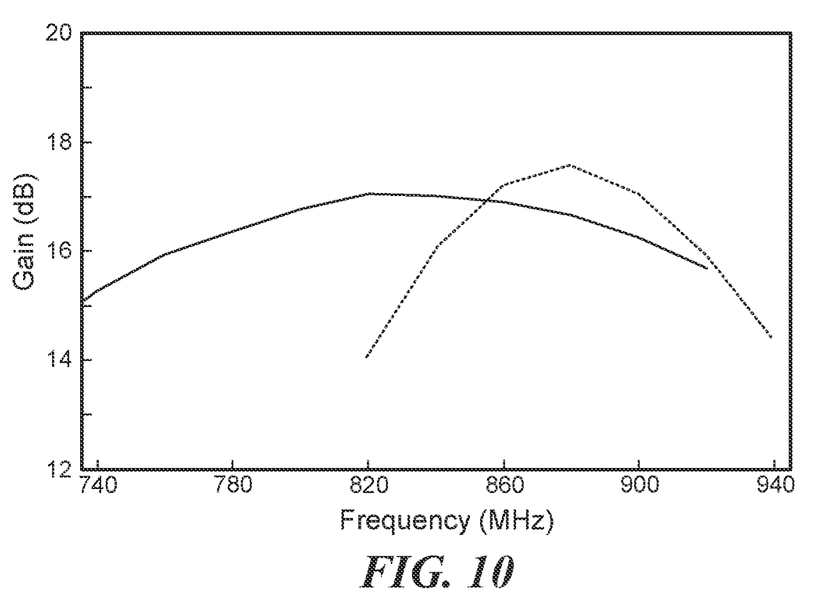
FIG. 10 illustrates a plot of gain as a function of frequency at average output power for a low-load-modulation broadband power amplifier (solid curve) and conventional Doherty amplifier (dotted curve) according to various embodiments described herein.

FIG. 10 plots gain curves for the low-load-modulation, broadband power amplifier 500 and for a conventional Doherty amplifier, each operating at an average output power of 49.5 dBm. The solid line plots measured gain at different frequencies for the low-load-modulation, broadband power amplifier 500. The power amplifier 500 provides a peak gain of approximately 17 dB at a mid-band frequency of about 820 MHz. The gain rolls off to 3 dB points that lie outside the plotted data. An estimated 3 dB bandwidth for this amplifier is about 220 MHz, yielding a fractional gain bandwidth at average output power of about 26.7%.

For comparison, the dashed line plots measured gain at different frequencies for the conventional Doherty amplifier. This amplifier provides a peak gain of about 17.5 dB at a mid-band frequency of 880 MHz, which rolls off to 3 dB points at about 825 MHz and about 940 MHz, yielding a fractional gain bandwidth at average output power of about 13%. The results in FIG. 10 indicate that the power amplifier 500 can provide an improvement in gain, at an average output power level, by a factor of 2 or more.

Figure 11:
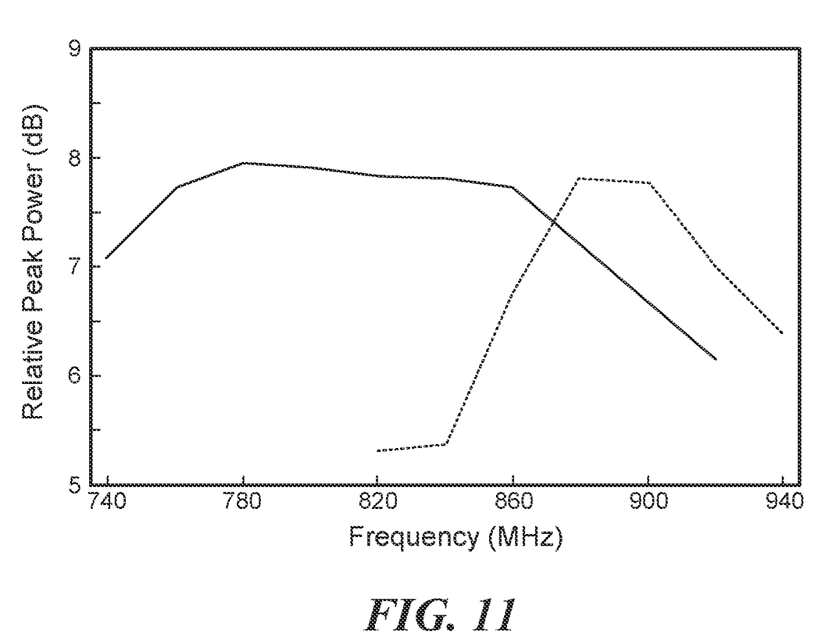
FIG. 11 illustrates a plot of relative power output (relative to average power) as a function of frequency for a low-load-modulation broadband power amplifier (solid curve) and a conventional Doherty amplifier (dotted curve) according to various embodiments described herein.

Other types of bandwidth values can be expressed for power amplifiers. Whereas the results of FIG. 10 can be used to obtain gain bandwidth values expressed in terms of 3 dB gain points when the amplifiers are operating at average power output values, it may be desirable to express amplifier bandwidth for peak output powers. The results plotted in FIG. 11 can be used to express amplifier bandwidth in terms of peak output power. In FIG. 11, the curves plot peak power (relative to average output power) as a function of frequency for the power amplifier 500 (solid line) and a conventional Doherty amplifier (dashed line). In this example, the Doherty amplifier is capable of the same peak output power levels as the power amplifier 500, but over a bandwidth that is significantly more narrow. In some applications, such as for wireless communications, it may be desirable to use an amplifier that can provide peak output power levels above a specified threshold power level over a broad range of signal frequencies when handling heavy communication loads. As an example, it may be desirable for an amplifier to output power levels that are at least 7 dB above average output power levels over a broad range of frequencies. The results of FIG. 11 indicate that the power amplifier 500 can satisfy this requirement over a range of frequencies from approximately 735 MHz to approximately 888 MHz, representing a peak power bandwidth of about 153 MHz for a mid-band frequency of about 810 MHz (~19%). In comparison, the Doherty amplifier satisfies the requirement for a bandwidth that is about 55 MHz with a mid-band frequency of about 890 MHz (~6%). In this case, the fractional peak-power bandwidth of the low-load-modulation, broadband power amplifier 500 can be at least 3 times greater than the fractional peak-power bandwidth for a conventional Doherty amplifier.

Although the example results shown in FIG. 8 through FIG. 11 are for a low-load-modulation, broadband power amplifier 500 designed for a carrier frequency of approximately 850 MHz and a symmetric design in which $i_m = i_{p1} = i_{p2}$, other embodiments of low-load-modulation, broadband power amplifiers are possible. In some embodiments, the power amplifier 500 can be designed for carrier frequencies in a range between 400 MHz and 6 GHz. The peak output power from the amplifier 500 can be between 1 Watt and 1,000 Watts in some cases. Additionally, asymmetric designs can be implemented in which two or more of $i_m$, $i_{p1}$, and $i_{p2}$ are not equal.

As used herein, the phrase "gallium-nitride material" refers to gallium nitride (GaN) and any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphoride nitride ($GaAs_xP_yN_{(1-x-y)}$), aluminum indium gallium arsenide phosphoride nitride ($Al_xIn_yGa_{(1-x-y)}As_aP_bN_{(1-a-b)}$), amongst others. Typically, when present, arsenic and/or phosphorous are at low concentrations (i.e., less than 5 percent by weight). In certain preferred embodiments, the gallium-nitride material has a high concentration of gallium and includes little or no amounts of aluminum and/or indium. In high gallium concentration embodiments, the sum of (x+y) may be less than 0.4 in some implementations, less than 0.2 in some implementations, less than 0.1 in some implementations, or even less in other implementations. In some cases, it is preferable for at least one gallium-nitride material layer to have a composition of GaN (i.e., x=y=a=b=0). For example, an active layer in which a majority of current conduction occurs may have a composition of GaN. Gallium-nitride materials in a multi-layer stack may be doped n-type or p-type, or may be undoped.

Power amplifiers of the present embodiments can be included in electronic devices associated with radio-frequency (RF) communications, radar, RF energy, power conversion, and microwave applications. For example, power amplifiers of the present embodiments can be included mobile phones, cellular base stations, tablets, and laptop computers as well as power inverters, voltage converters, radar transmitters, and microwave generators.

Methods of operating a low-load-modulation power amplifier are also contemplated in the embodiments. An example method can comprise acts of amplifying, with a main amplifier, a first portion of a received signal, providing the amplified first portion to a first impedance inverter, and receiving, at a first node, a first signal from the first impedance inverter. An example method can also include acts of amplifying, with a first peaking amplifier arranged in parallel with the main amplifier, a second portion of the received signal, and receiving, at the first node, a second signal from the first peaking amplifier. There may be no impedance inverters between the first peaking amplifier and the first node.

Further acts can include providing a first combined signal from the first node to a second impedance inverter and providing an output signal from the second impedance inverter to a second node. Further acts can include amplifying, with a second peaking amplifier arranged in parallel with the first peaking amplifier, a third portion of the received signal, providing an output from the second peaking amplifier to a third impedance inverter, and receiving, at the second node, a third signal from the third impedance inverter. The amplification by the main amplifier, first peaking amplifier, and second peaking amplifier can occur in parallel circuit branches of a low-load-modulation, broadband power amplifier. Additional acts for operating a low-load-modulation, broadband power amplifier can be included in accordance with the above-described features and structure of low-load-modulation, broadband power amplifiers.

The features, structures, or characteristics described above may be combined in one or more embodiments in any suitable manner, and the features discussed in the various embodiments can be interchangeable among the embodiments. In the foregoing description, numerous specific details are provided in order to fully understand the embodiments of the present disclosure. However, a person skilled in the art will appreciate that the technical solution of the present disclosure may be practiced without one or more of the specific details, or other methods, components, materials, and the like may be employed. In other instances, well-known structures, materials, or operations are not shown or described in detail to avoid obscuring aspects of the present disclosure.

As used herein, terms such as "a," "an," "the," and "said" are used to indicate the presence of one or more elements and components. The terms "comprise," "comprising," "include," "including," "have," "having," "contain," "containing," and their variants are open ended and can include additional elements, components, etc., in addition to the listed elements, components, etc. unless otherwise specified. The terms "first," "second," etc. are used only as labels, rather than a limitation for a number of the objects. Additionally, the term "coupled" may or may not include intermediary components between the components that are coupled to each other. The term "connected" also may or may not include intermediary components between the components that are connected to each other. The term "directly connected" means a direct connection between the components that are directly connected to each other, without any intermediary components between the directly-connected components. The term "substantially" is used as a reference to the extent possible (or given best efforts), while at the same time accounting for typical manufacturing, design, and practical constraints. Thus, depending upon the capabilities in the field, "substantially equal" could amount to equality within a deviation of 3%, 5%, 7%, or 10%, as examples.

The features of the embodiments described herein are representative and, in alternative embodiments, certain features and elements can be added or omitted. Additionally, modifications to aspects of the embodiments described herein can be made by those skilled in the art without departing from the spirit and scope of the present invention defined in the following claims, the scope of which are to be accorded the broadest interpretation so as to encompass modifications and equivalent structures.

The invention claimed is:

1. A power amplifier comprising:
   a main amplifier coupled to a first combining node;
   a first impedance inverter between the main amplifier and the first combining node;
   a first peaking amplifier directly connected to the first combining node;
   a second impedance inverter between the first combining node and a second combining node;
   a second peaking amplifier coupled to the second combining node; and
   a third impedance inverter between the second peaking amplifier and the second combining node, wherein:
      the main amplifier outputs an amount of maximum power or current that differs by at least 20% from an amount of maximum power or current output by the first peaking amplifier and outputs the amount of maximum power or current that differs by at least 20% from an amount of maximum power or current output by the second peaking amplifier.

2. The power amplifier of claim 1, wherein an impedance at an output of the first peaking amplifier is substantially equal to an impedance at the output of the second peaking amplifier when the first and second peaking amplifiers are fully amplifying.

3. A power amplifier comprising:
a main amplifier coupled to a first combining node;
a first impedance inverter between the main amplifier and the first combining node;
a first peaking amplifier directly connected to the first combining node;
a second impedance inverter between the first combining node and a second combining node;
a second peaking amplifier coupled to the second combining node; and
a third impedance inverter between the second peaking amplifier and the second combining node wherein:
$Z_{o2}$ is a characteristic impedance for the second impedance inverter;
$Z_{o3}$ is a characteristic impedance for the third impedance inverter; and
a ratio of $Z_{o2}$ and $Z_{o3}$ substantially satisfies the following relation to within 10%:

$$\frac{Z_{O3}}{Z_{O2}} = \frac{(i_m + i_1)}{\sqrt{i_1 i_2}},$$

where $i_m$ represents a maximum amount of current output by the main amplifier, $i_1$ represents a maximum amount of current output by the first peaking amplifier, and $i_2$ represents a maximum amount of current output by the second peaking amplifier when the main amplifier, the first peaking amplifier, and the second peaking amplifier are fully amplifying.

4. The power amplifier of claim 1, wherein:
the main amplifier, the first peaking amplifier, and the second peaking amplifier are provided in three parallel circuit branches of the power amplifier; and
the power amplifier further comprises a power splitter or coupler that divides a received signal into a second circuit branch of the three parallel circuit branches that contains the first peaking amplifier and into a third circuit branch of the three parallel circuit branches that contains the second peaking amplifier, wherein a carrier wave for a signal travelling from the splitter or coupler to the second combining node in the third circuit branch accrues N×180° additional phase compared to the carrier wave for a signal travelling from the power splitter or coupler to the second combining node in the second circuit branch, wherein N is an integer greater than 0.

5. The power amplifier of claim 1, wherein there is no impedance inverter between the first peaking amplifier and the first combining node.

6. The power amplifier of claim 1, further comprising an output impedance inverter between the second combining node and an output terminal of the power amplifier.

7. The power amplifier of claim 1, wherein the first impedance inverter, the second impedance inverter, and the third impedance inverter each delay a phase of a carrier wave by an amount between 85 degrees and 95 degrees.

8. The power amplifier of claim 1, wherein the first impedance inverter has a characteristic impedance that is equivalent, within 10%, to a square root of a product of an impedance of a load that the power amplifier drives and an impedance seen at an output of the second combining node.

9. The power amplifier of claim 1, further comprising an output terminal of the power amplifier coupled to the second combining node, wherein the output terminal connects to a load comprising a real impedance $R_L$ between 5 ohms and 100 ohms.

10. The power amplifier of claim 1, wherein the main amplifier operates in a first amplifier class, and the first peaking amplifier and the second peaking amplifier operate in a second amplifier class that is different from the first amplifier class.

11. The power amplifier of claim 1, wherein the first peaking amplifier and the second peaking amplifier enter a non-amplifying state when an input signal to the power amplifier drops below a threshold value, while the main amplifier continues to amplify a received input signal.

12. The power amplifier of claim 1, wherein the first peaking amplifier and the second peaking amplifier output a same amount of maximum power or current to within 10% of each other.

13. The power amplifier of claim 3, wherein:
the main amplifier outputs a same amount of maximum power or current as that for the first peaking amplifier to within 10%; and
the first peaking amplifier and the second peaking amplifier output a same amount of maximum power or current to within 10% of each other.

14. The power amplifier of claim 3, wherein the main amplifier outputs an amount of maximum power or current that differs by at least 20% from an amount of maximum power or current output by the first peaking amplifier.

15. The power amplifier of claim 1, wherein the main amplifier outputs an amount of maximum power or current that differs from that output by the first peaking amplifier such that a relative location of a peak back-off efficiency for the power amplifier is between −7 dB and −14 dB.

16. The power amplifier of claim 1, wherein the first peaking amplifier outputs a first amount of maximum power, and the second peaking amplifier outputs a second amount of maximum power that is different from the first amount of maximum power by at least 20%.

17. A method of operating a power amplifier, the method comprising:
amplifying, with a main amplifier, a first portion of a received signal;
providing a first output from the main amplifier to a first impedance inverter;
receiving, at a first combining node, a first signal from the first impedance inverter;
amplifying, with a first peaking amplifier arranged in parallel with the main amplifier, a second portion of the received signal;
receiving, at the first combining node, a second signal from the first peaking amplifier, with the first peaking amplifier being directly connected to the first combining node;
providing a first combined signal from the first combining node to a second impedance inverter;
providing an output signal from the second impedance inverter to a second combining node;
amplifying, with a second peaking amplifier arranged in parallel with the first peaking amplifier, a third portion of the received signal;
providing an output from the second peaking amplifier to a third impedance inverter;

receiving, at the second combining node, a third signal from the third impedance inverter; and outputting, by the main amplifier, an amount of maximum power or current that differs by at least 20% from an amount of maximum power or current output by the first peaking amplifier and outputting, by the main amplifier, the amount of maximum power or current that differs by at least 20% from an amount of maximum power or current output by the second peaking amplifier.

18. The method of claim 17, wherein the second signal does not pass through an impedance inverter when travelling from an output of the first peaking amplifier to the first combining node.

19. The method of claim 17, further comprising delaying, between an input terminal of the power amplifier and the second combining node, a carrier wave of the third portion of the received signal by N×180 degrees, to within 10%, with respect to a carrier wave of the second portion of the received signal, wherein N is an integer greater than 0.

20. The method of claim 17, further comprising:
operating the main amplifier in a first amplifier class; and
operating the first peaking amplifier and the second peaking amplifier in a second amplifier class that is different from the first amplifier class.

21. The method of claim 17, further comprising:
transitioning the first peaking amplifier and the second peaking amplifier to a non-amplifying state when an input signal to the power amplifier drops below a threshold value; and
continuing amplification, by the main amplifier, when the input signal to the power amplifier drops below the threshold value.

22. The method of claim 17, further comprising providing a second combined signal from the second combining node to an output impedance inverter connected in series with the second combining node and an output terminal of the power amplifier.

23. The method of claim 17, further comprising driving, with the power amplifier, a load having a real impedance $R_L$ between 5 ohms and 100 ohms.

24. The method of claim 17, further comprising outputting a same amount of maximum power or current to within 10% from the first peaking amplifier and the second peaking amplifier when the first peaking amplifier and the second peaking amplifier are fully amplifying.

25. The method of claim 17, further comprising:
outputting, by the first peaking amplifier, a first amount of maximum power; and
outputting, by the second peaking amplifier, a second amount of maximum power that is different from the first amount of maximum power by at least 20% when the first peaking amplifier and second peaking amplifier are fully amplifying.

26. The power amplifier of claim 3, wherein the first peaking amplifier outputs a first amount of maximum power, and the second peaking amplifier outputs a second amount of maximum power that is different from the first amount of maximum power by at least 20%.

27. The power amplifier of claim 3, wherein the main amplifier outputs an amount of maximum power or current that differs from that output by the first peaking amplifier such that a relative location of a peak back-off efficiency for the power amplifier is between −7 dB and −14 dB.

* * * * *